United States Patent [19]
Liu

[11] Patent Number: 6,166,902
[45] Date of Patent: Dec. 26, 2000

[54] CPU MODULE FOR COMPACTPCI-BASED COMPUTER

[76] Inventor: Jin Liu, 5F,No.168-1, Lien Chen Rd., Chung Ho, Taipei Hsien, Taiwan

[21] Appl. No.: 09/243,126

[22] Filed: Feb. 3, 1999

[51] Int. Cl.[7] .................................. G06F 1/16; H05K 5/00
[52] U.S. Cl. ............................................................. 361/685
[58] Field of Search ...................................... 361/684, 685

[56] References Cited

U.S. PATENT DOCUMENTS

| | | |
|---|---|---|
| 5,546,276 | 8/1996 | Cutts et al. . |
| 5,984,688 | 11/1999 | Norris . |
| 6,018,457 | 1/2000 | Mroz ....................................... 361/685 |
| 6,052,277 | 4/2000 | Liu et al. ................................ 361/685 |
| 6,052,281 | 4/2000 | Hardt et al. .......................... 361/684 X |
| 6,058,007 | 5/2000 | Eckert et al. ........................... 361/684 |

*Primary Examiner*—Jeffrey Donels
*Attorney, Agent, or Firm*—Dougherty & Troxell

[57] ABSTRACT

A CPU module for compactPCI-based computer, including a fixing board having a first surface and a second surface opposite to the first surface is disclosed. A first fixing member is disposed on the first surface for fixing a first peripheral equipment of the computer. A second fixing member is disposed on the second surface for selectively fixing a second peripheral equipment of the computer. The first fixing member includes two sets of fixing plates spaced from each other by a distance sufficiently long for receiving therein the first peripheral equipment. Each of the fixing plates is formed with a hole for a screw to pass there through for fixing the first peripheral equipment on the fixing board. The second fixing member also includes multiple holes for screws to pass there through for fixing the second peripheral equipment on the fixing board. Multiple spacing posts are disposed on the fixing board for supporting and fixing a main board thereon. One single fixing board is used to connect together the respective main components of the CPU module of the compactPCI-based computer.

16 Claims, 5 Drawing Sheets

CPU MODULE FOR COMPACTPCI-BASED COMPUTER

BACKGROUND OF THE INVENTION

1. Field of the Invention

The present invention relates to a compactPCI-based computer, and more particularly to a CPU module for compactPCI-based computer with a simpler and more compact structure.

2. Description of the Prior Art

Besides the desktop-sized and notebook-sized personal computers that have been widely used in homes, schools and offices, the so-called industrial computers have also been widely used in the industry field. Due to the server environment that may be encountered in industry, industrial computers are designed to be more durable and more protected against poor environment. In addition, the industrial computers also need a more compact design to take a smaller space. Currently, there are different specifications and standards for the industrial computers among which the so-called "compactPCI" specifies a PCI-based computer system that under control of a cooperative software can be connected to those interface cards compatible with PCI (peripheral component interconnect) specification, such as analog-to-digital converter card, digital control card, timer or counter, and relay control cards.

The PCI specification is regulated by PICMG International Organization for specifically limiting the size of the circuit board. For example, the plane size of the circuit board module is limited to 160 mm×100 mm and the thickness thereof is limited to 20.08 mm. Such 20.08 mm thickness is usually called as one "unit width".

On the other hand, an independently operable computer system inevitably includes (1) a main board including a central processor and relevant peripheral electronic elements and (2) data storage including fixed type data storage such as hard disc, and movable data storage such as floppy disc and compact disc. The existing commercially available standard hard disc has a specification of 2.5 inches, while the floppy disc 3.5 inches. Therefore, when installing both in a compactPCI-based computer, a considerable amount of room is occupied. In the conventional installation, generally four unit width are required for time receiving the main board, hard disc and floppy disc.

In order to reduce the occupied room in the compactPCI-based computer, it has been tried to secure the hard disc and floppy disc on different fixing boards, each occupying one unit width. In addition to the one unit width occupied by the main board, only three unit width are necessary rather than four as the aforesaid installation. This measure is able to reduce the occupied room in the compactPCI-based computer. However, at least two fixing boards are needed for respectively fixing the hard disc and floppy disc. This increases the number of the components. Moreover, it is necessary to respectively connect the hard disc and floppy disc modules to the CPU module via cable or bus. Such assembly is relatively complicated.

SUMMARY OF THE INVENTION

It is therefore a primary object of the present invention to provide a CPU module for a compactPCI-based computer, which is able to reduce the room occupied by the CPU module of compactPCI-based computer.

It is a further object of the present invention to provide a CPU module for a compactPCI-based computer, in which the number of the necessary components is reduced and the structure of the assembly is simplified.

It is still a further object of the present invention to provide the above CPU module for compactPCI-based computer, which can be easily manufactured at low cost.

It is still a further object of the present invention to provide the above CPU module for compactPCI-based computer, in which the length of the cable or bus for connecting various data storage devices with the main board is minimized.

The present invention can be best understood through the following description and accompanying drawings, wherein:

DETAILED DESCRIPTION OF THE PREFERRED EMBODIMENTS

Figure 1:
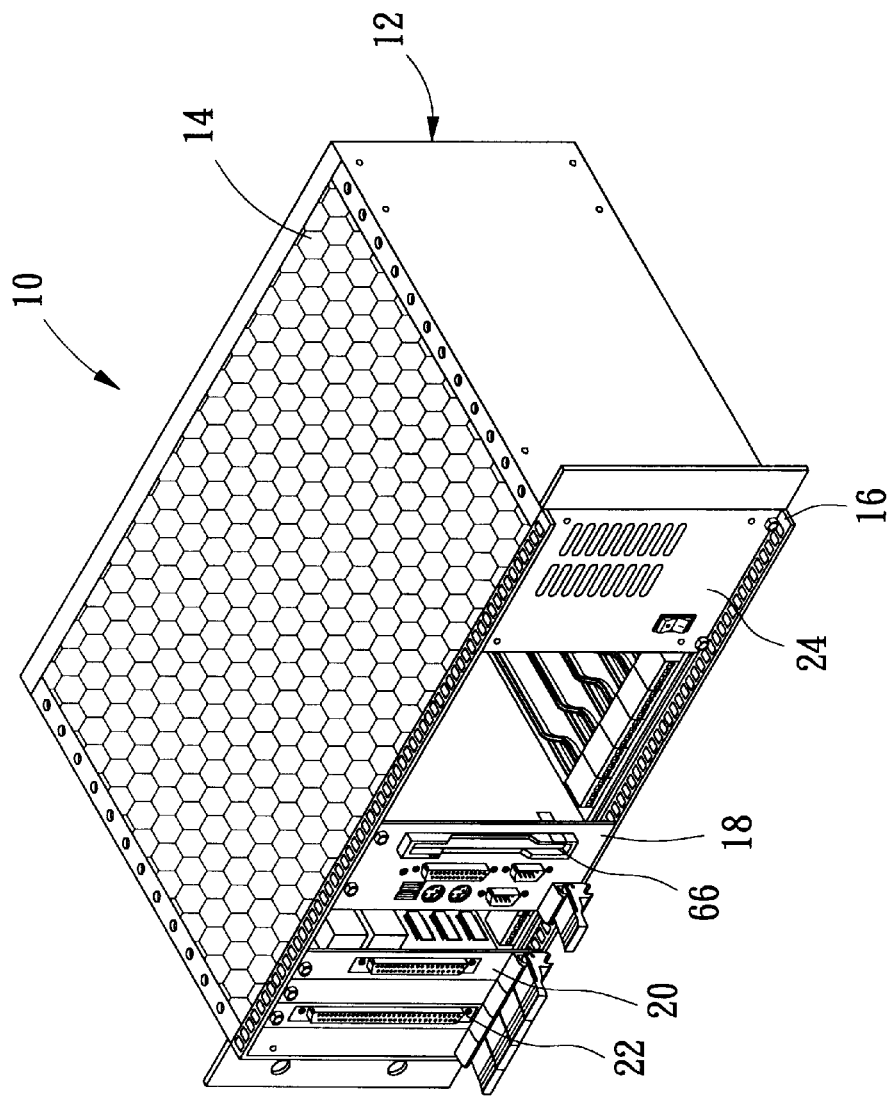
FIG. 1 is a perspective view of a compactPCI-based computer in which the CPU module of the present invention is installed.

Referring to FIG. 1, a compactPCI-based computer, generally designated at 10, is shown. The compactPCI-based computer mentioned in the description is not limited to industrial compactPCI-based computer. Other suitable computers are also included in the scope of the present invention. The compactPCI-based computer 10 has a housing 12 which includes at least an upper wall 14 and a lower wall 16. The respective components of the compactPCI-based computer 10 are enclosed by the housing 12, including a CPU module 18 and various function modules 20, 22 and a power supply 24.

Figure 2:
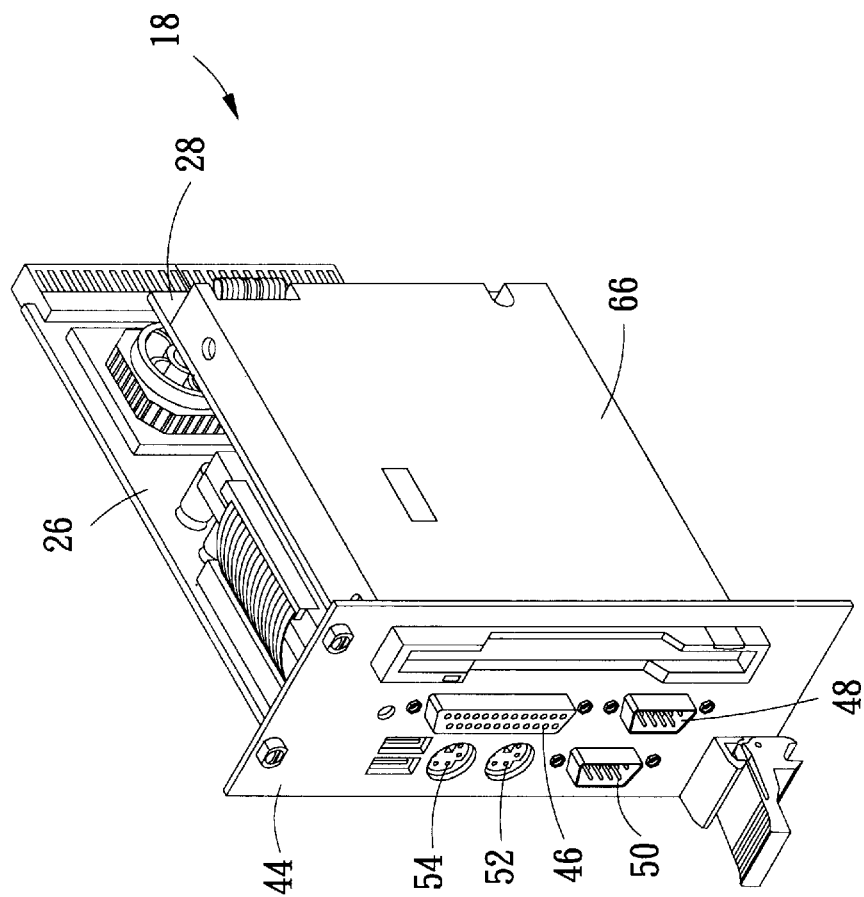
FIG. 2 is a perspective view of the CPU module of the present invention.
Figure 3:
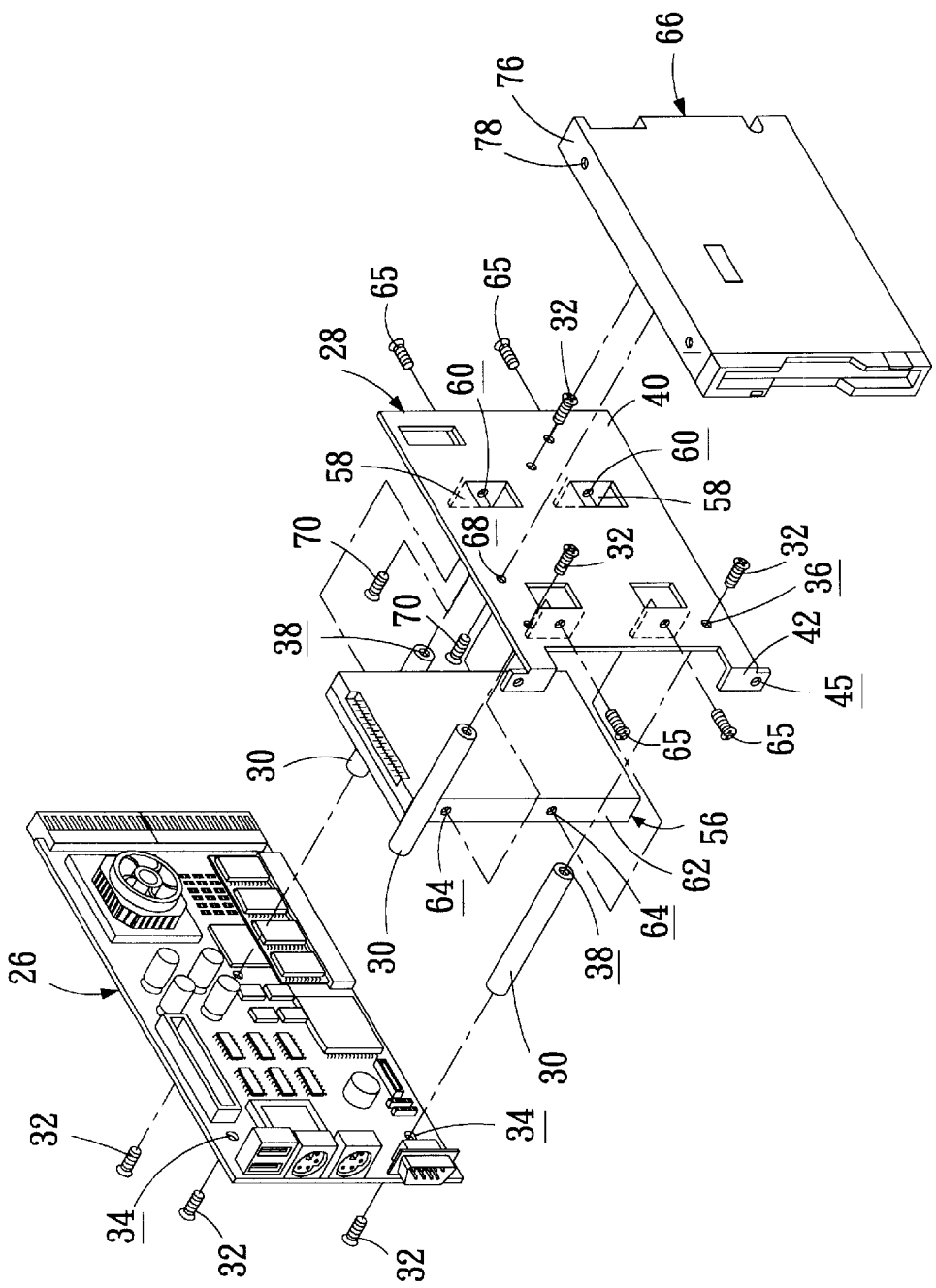
FIG. 3 is a perspective exploded view of the CPU module of the present invention.
Figure 4:
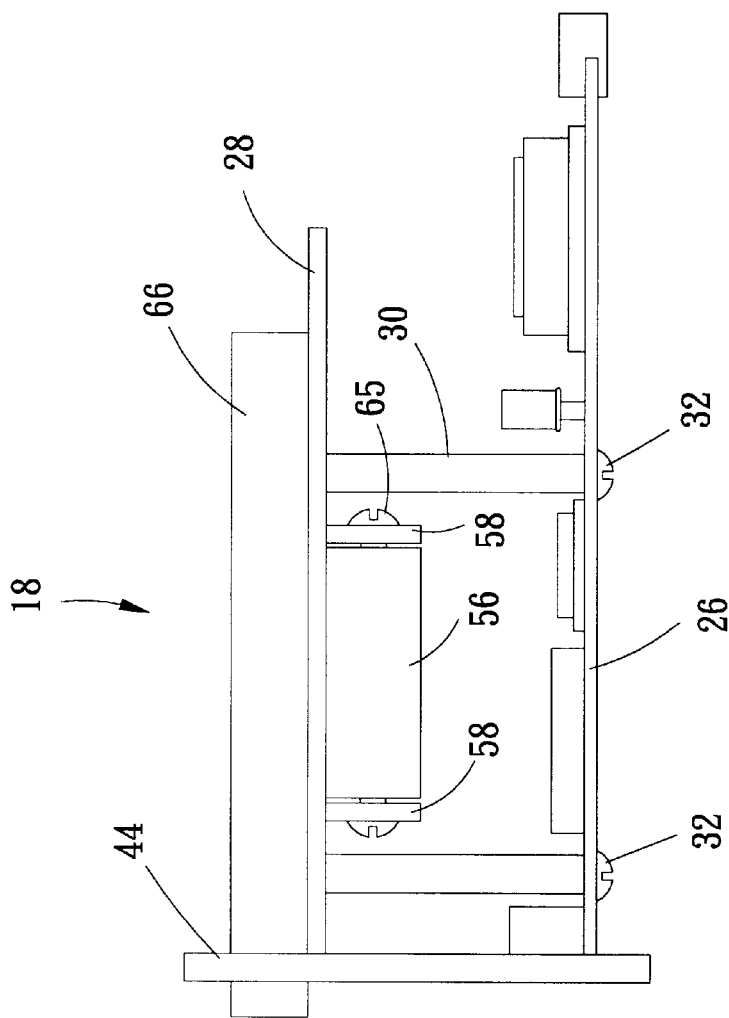
FIG. 4 is a bottom view of the CPU module of the present invention.

Referring to FIGS. 2 to 4, the CPU module 18 of the present invention includes a main board 26 and a fixing board 28 which are fixed together and spaced from each other by a certain distance. As shown in FIGS. 3 and 4, between the main board 26 and the fixing board 28 are disposed multiple spacing posts 30. There are three spacing posts 30 shown in FIGS. 3 and 4, each having a given length. Two ends of the spacing post 30 respectively abut against the main board 26 and the fixing board 28 so as to space the main board 26 and the fixing board 28 by a predetermined distance. Accordingly, the length of the spacing post 30 is substantially equal to the distance between the main board 26 and the fixing board 28.

The spacing posts 30 are connected with the main board 26 and the fixing board 28 by suitable fastening means which preferably are screws 32 passing through holes 34 and 36 formed on the main board 26 and the fixing board 28 and screwed into the threaded holes 38 formed at two ends of each spacing post 30. Accordingly, the main board 26 and the fixing board 28 can be locked on the spacing posts 30.

The structure and arrangement of the main board 26 are well known by those skilled in this field and are not included in the scope of the present invention. Therefore, they will not be further described herein below.

The fixing board 28 includes a panel-like base plate 40. A lateral side of the base plate 40 is formed with at least one flange 42 for connecting the fixing board 28 to a panel 44 (see FIGS. 2 and 4) with the base plate 40 substantially normal to the panel 44. The panel 44 serves to fix the fixing board 28 to the housing 12 of the compactPCI-based computer 10. The connection can be achieved by conventional measures such as screws.

It should be noted that connectors 46, 48, 50, 52, 54 as shown in FIG. 2 can be arranged on the panel 44 for connecting other peripheral devices (not shown) to the main board 26.

In the above embodiment, the fixing board 28 is connected with the panel 44 by screws (not shown) which is passed through the holes 45 of the flange 42 of the base plate 40 to lock the fixing board 28 to the panel 44. However, other suitable measures for the connection can be also used to achieve the same effect.

The base plate 40 of the fixing board 28 is disposed with a first fixing member for fixing a first data devices 56 of the compactPCI-based computer 10, which in this embodiment is a hard disc. The first fixing member includes two sets of opposite fixing plates 58 spaced from each other by a distance substantially equal to the width of the first data storage devices 56 for receiving the first data storage devices 56 there between. Each set of fixing plate includes at least one fixing plate 58. Preferably, as shown in the figures, each set includes two spaced fixing plates 58.

In other words, in this embodiment, there are totally four fixing plates 58 disposed on the base plate 40 of the fixing board 28. Each fixing plate 58 is formed with a hole 60. A lateral wall 62 of the first data storage devices 56 adjacent to the fixing plate 58 is formed with a threaded hole 64 corresponding to the hole 60, whereby a screw 65 can be passed through the hole 60 of the fixing plate 58 and screwed into the thread hole 64 of the first data storage devices 56 so as to fix the first data storage devices 56 on the fixing board 28.

The fixing plates 58 are formed on a first surface of the base plate 40 of the fixing board 28 opposite to the main board 26. Therefore, the first data storage devices 56 fixed on the fixing board 28 is positioned in the space between the main board 26 and the fixing board 28. However, it should be noted that the fixing plates 58 can be alternatively formed on the other surface (second surface opposite to the first surface) of the base plate 40 of the fixing board 28.

According to a preferred embodiment of the present invention, the fixing plates 58 are integrally formed on the base plate 40 of the fixing board 28 by punching. However, other measures are also applicable. For example, small plate materials can be directly welded with the main body.

A second fixing member is disposed on a second surface of the base plate 40 of the fixing board 28 for fixing a second data storage devices 66 on the fixing board 28. In this embodiment, the second data storage devices 66 is a floppy disc. However, it can be other data storage devices such as a CD ROM.

Similarly, the first data storage devices 56 can be data storage devices other than the hard disc. Alternatively, the first and second data storage devices 56, 66 can be peripheral devices of the computer with suitable dimension other than the data storage.

According to the above embodiment, the second fixing member includes multiple holes 68 formed on the base plate 40 of the fixing board 28 corresponding to the threaded holes (not shown) formed on the bottom face of the second data storage devices 66. A screw 70 can be passed through the hole 68 and screwed into the threaded hole of the second data storage devices 66 so as to fix the second data storage devices 66 on the second surface of the base plate 40 of the fixing board 28.

In the above embodiment, the second data storage devices 66 is arranged on the second surface of the fixing board 28 not facing the main board 26. However, as necessary, the positions of the second data storage devices 66 and the first data storage devices 56 can be exchanged.

It should be also noted that in the above description, the first and second fixing members both employ screws 65, 70 to fix the first and second data storage devices 56, 66. However, other fixing measures such as engaging sockets or guide rails can be also used to fix the first and second data storage devices 56, 66 onto the fixing board 28.

In conclusion, the present invention employs only one fixing board 28 to fix both the first and second data storage devices 56, 66 on the panel 44 and only a room of three unit widths is occupied. Such structure is much simpler than the conventional device. Also, the number of the components are reduced. In addition, the second data storage devices 66 is mounted on the second surface of an outer side of the fixing board 28 so that in the case that the second data storage devices 66 is not necessary to use, the same can be selectively removed. Accordingly, the entire CPU module 18 of the present invention will occupy only a room of two unit widths to further reduce the room necessary for the CPU module 18.

Figure 5:
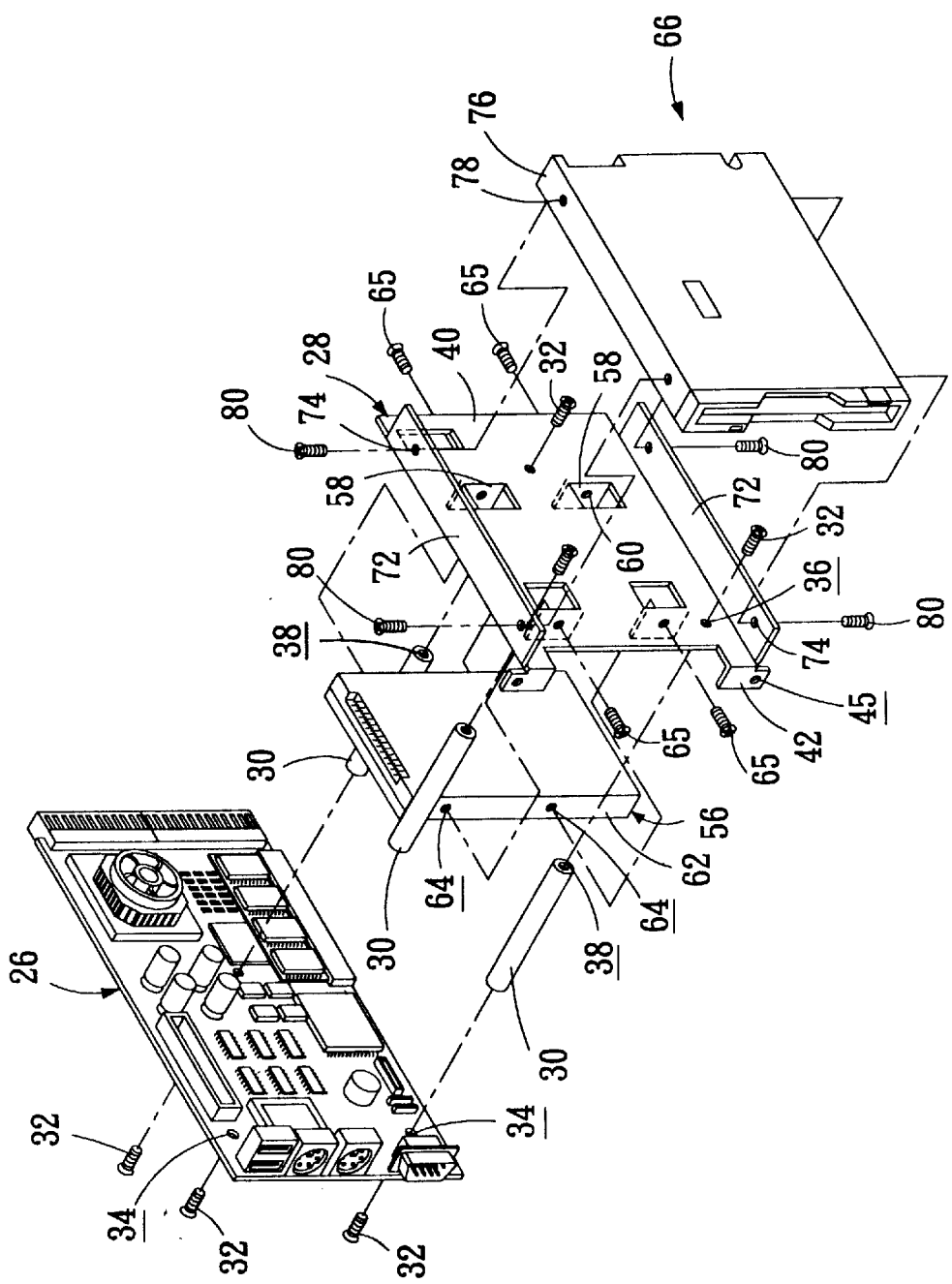
FIG. 5 is a perspective exploded view of another embodiment of the CPU module of the present invention.

FIG. 5 shows a second embodiment of the present invention. The second fixing member of the fixing board 28 for fixing the second data storage devices 66 includes two flanges 72 disposed on the second surface of the base plate 40 of the fixing board 28. The two flanges 72 are spaced from each other by a certain distance sufficiently large for receiving the second data storage devices 66 therein. Each flange 72 is formed with at least one hole 74 corresponding to a threaded hole 78 formed on a lateral wall 76 of the second data storage 66 for a screw 80 to pass there through to connect the second data storage 66 with the fixing board 28.

It should be noted that the above description and accompanying drawings are only used to illustrate some embodiments of the present invention, not intended to limit the scope thereof. Any modification of the embodiments should fall within the scope of the present invention.

What is claimed is:

1. A CPU module for compactPCI-based computer, comprising a fixing board having a panel-like base plate having a first surface and a second surface opposite to the first surface, a first fixing member being disposed on the first surface for fixing a first peripheral equipment of the compactPCI-based computer, a second fixing member being disposed on the second surface for selectively fixing a second peripheral equipment of the computer, the first fixing member including two sets of fixing plates opposite to and spaced from each other by a first distance, the first distance being sufficiently long for receiving therein the first peripheral equipment, each of the fixing plates serving to fix the first peripheral equipment thereon via a fastening member.

2. The CPU module for compactPCI-based computer as claimed in claim 1, wherein the fastening member comprises a screw and each fixing plate is formed with a hole corresponding to a thread hole formed on the first peripheral equipment, whereby the screw is passed through the hole and screwed into the thread hole so as to fix the first peripheral equipment on the fixing plate.

3. The CPU module for compactPCI-based computer as claimed in claim 1, wherein each set of fixing plates comprises at least one fixing plate.

4. The CPU module for compactPCI-based computer as claimed in claim 1, wherein each set of fixing plates comprises two fixing plates.

5. The CPU module for compactPCI-based computer as claimed in claim 1, wherein the second fixing member comprises at least one hole formed on the base plate of the fixing board, a fastening member being disposed in the hole for fixing the second peripheral equipment on the second surface of the base plate of the fixing board.

6. The CPU module for compactPCI-based computer as claimed in claim 5, wherein the fastening member comprises a screw and the hole of the second fixing member corresponds to a thread hole formed on the second peripheral equipment, whereby the screw is passed through the hole and screwed into the thread hole so as to fix the second peripheral equipment on the second surface of the base plate of the fixing plate.

7. The CPU module for compactPCI-based computer as claimed in claim 1, wherein the second fixing member comprises two flanges disposed on the second surface of the base plate of the fixing board, the two flanges being opposite to and spaced from each other by a second distance which is sufficiently long for receiving therein the second peripheral equipment, each flange being formed with at least one hole in which a fastening member is disposed for fixing the second peripheral equipment on the second surface of the fixing board.

8. The CPU module for compactPCI-based computer as claimed in claim 7, wherein the fastening member comprises a screw and the hole formed on the flange of the second fixing member corresponds to a thread hole formed on the second peripheral equipment, whereby the screw is passed through the hole and screwed into the thread hole so as to fix the second peripheral equipment on the second surface of the base plate of the fixing board.

9. The CPU module for compactPCI-based computer as claimed in claim 1, further comprising multiple spacing posts each having a given length and including a first end and a second end, the first end being fixed on the first surface of the base plate of the fixing board, the second end being fixed to a main board for supporting the main board, the first surface of the base plate of the fixing board and the main board defining therebetween a space for receiving therein the first peripheral equipment.

10. The CPU module for compactPCI-based computer as claimed in claim 9, wherein the first end of each spacing post is formed with a thread hole and the base plate of the fixing board is formed with a hole corresponding to the thread hole, whereby a screw is passed through the hole and screwed into the thread hole to fix the spacing post on the fixing board.

11. The CPU module for compactPCI-based computer as claimed in claim 9, wherein the second end of each spacing post is formed with a thread hole and the main board is formed with a hole corresponding to the thread hole, whereby a screw is passed through the hole and screwed into the thread hole to fix the main board at the second end of the spacing post.

12. The CPU module for compactPCI-based computer as claimed in claim 1, wherein the base plate of the fixing board is formed with at least one fixing flange for fixing the fixing board on a panel which is secured to a housing of the computer.

13. The CPU module for compactPCI-based computer as claimed in claim 1, wherein the first and second peripheral equipment each comprise a data storage device.

14. The CPU module for compactPCI-based computer as claimed in claim 13, wherein the first peripheral equipment is a hard disc.

15. The CPU module for compactPCI-based computer as claimed in claim 13, wherein the second peripheral equipment is a floppy disc.

16. The CPU module for compactPCI-based computer as claimed in claim 1, wherein the fixing plate is integrally formed on the base plate of the fixing board.

* * * * *